(12) United States Patent
Hashimoto et al.

(10) Patent No.: US 10,475,374 B2
(45) Date of Patent: Nov. 12, 2019

(54) DISPLAY DEVICE

(71) Applicant: InnoLux Corporation, Miao-Li County (TW)

(72) Inventors: Kazuyuki Hashimoto, Miao-Li County (TW); Hidetoshi Watanabe, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/921,647

(22) Filed: Mar. 14, 2018

(65) Prior Publication Data

US 2019/0287451 A1 Sep. 19, 2019

(51) Int. Cl.
*G09G 3/32* (2016.01)
*H01L 27/12* (2006.01)

(52) U.S. Cl.
CPC .......... *G09G 3/32* (2013.01); *H01L 27/1255* (2013.01); *G09G 2320/0219* (2013.01)

(58) Field of Classification Search
None
See application file for complete search history.

(56) References Cited

U.S. PATENT DOCUMENTS

| | | | |
|---|---|---|---|
| 5,991,467 A * | 11/1999 | Kamiko | G06K 9/0004 250/208.1 |
| 8,471,605 B2 | 6/2013 | Lee | |
| 2006/0071887 A1 * | 4/2006 | Chou | G09G 3/3233 345/82 |
| 2013/0050289 A1 | 2/2013 | Kang | |

* cited by examiner

*Primary Examiner* — Kenneth B Lee, Jr.
(74) *Attorney, Agent, or Firm* — Winston Hsu

(57) ABSTRACT

A display device includes at least one pixel circuit. A pixel circuit of the at least one pixel circuit includes a light emitting diode, a thin film transistor, a capacitor, and an adaptive voltage source. The light emitting diode has a first electrode, and a second electrode. The thin film transistor is coupled to the light emitting diode. The thin film transistor has a first terminal, a second terminal, and a control terminal for receiving a data voltage. The capacitor is coupled between the first terminal and the control terminal of the thin film transistor. The adaptive voltage source is coupled to the thin film transistor and fixes a voltage between the first terminal and the second terminal of the thin film transistor.

13 Claims, 6 Drawing Sheets

ID DEVICE

BACKGROUND OF THE DISCLOSURE

1. Field of the Disclosure

The present disclosure relates to a display device, and more particularly to a display device with high luminosity uniformity.

2. Description of the Prior Art

Display devices have been widely used in a variety of applications, such as smart phones, personal computers, and electronic book readers. However, according to usage scenarios of the applications, different types of display devices may be chosen. Among different types of display devices, light emitting diode (LED) display devices, such as mini-LED display devices, micro-LED display devices, and organic light emitting diode (OLED) display devices, are popular ones.

Usually, these display devices include a plurality of current drivers, each controlling the luminance of a light emitting unit in a pixel.

However, as the LED process and environment temperature vary, the forward voltage of the LED will change, causing unstable drain-to-source voltage of the transistor in the current driver. Meanwhile, the current driver itself will consume power, which limits the power efficiency of the display device. Therefore, it is desired to have a smaller drain-to-source voltage variation of the transistor in the current driver, making the control of the transistor to be complicate and difficult.

SUMMARY OF THE DISCLOSURE

One embodiment of the present disclosure discloses a display device. The display device includes at least one pixel circuit, which can overcome LED process and environment temperature variation, and reduce drain-to-source voltage variation of current driver.

A pixel circuit includes a light emitting diode (LED), a thin film transistor (TFT), a capacitor, and an adaptive voltage source.

The LED has a first electrode and a second electrode. The TFT is coupled to the LED. The TFT has a first terminal, a second terminal, and a control terminal for receiving a data voltage. The capacitor is coupled between the first terminal and the control terminal of the TFT. The adaptive voltage source is coupled to the TFT for fixing a voltage between the first terminal and the second terminal of the TFT.

Another embodiment of the present disclosure discloses a display device. The display device includes at least one pixel circuit.

A pixel circuit of the at least one pixel circuit includes a light emitting diode, plural first TFTs, and at least one capacitor.

The plural first thin TFTs are coupled to the LED, and each of the plural first TFTs is controlled by a corresponding control signal. Each of the at least one capacitor is coupled between a first terminal and a control terminal of a corresponding first TFT of the plural first TFTs.

These and other objectives of the present disclosure will no doubt become obvious to those of ordinary skill in the art after reading the following detailed description of the embodiment that is illustrated in the various figures and drawings.

DETAILED DESCRIPTION

Figure 1:
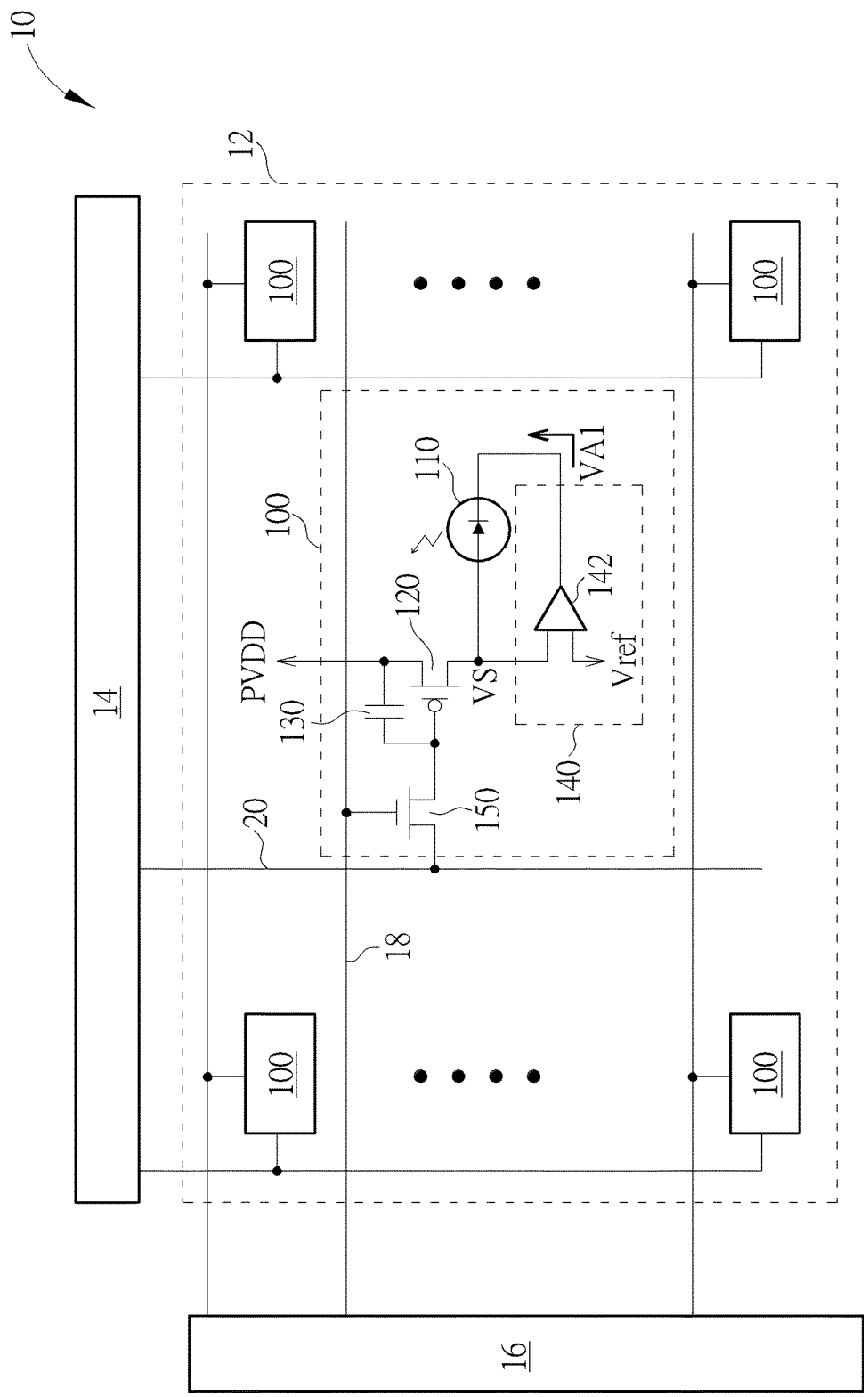
FIG. 1 shows a display device according to one embodiment of the present disclosure.

FIG. 1 shows a display device 10 according to one embodiment of the present disclosure. The display device 10 includes a display panel 12, a data driver 14, and a scan driver 16. The display panel 12 includes a pixel array. The pixel array includes at least one pixel circuit 100, and defines an active area of the display device 10.

The pixel circuit 100 includes a light emitting diode (LED) 110, a first thin film transistor (TFT) 120, a capacitor 130, a second TFT 150, and an adaptive voltage source 140. The LED 110 can be an organic light emitting diode (OLED), a mini-LED, a micro-LED or a quantum-dot LED (QLED), but not limited thereto.

The first TFT 120 is coupled to the LED 110. The first TFT 120 has a first terminal, a second terminal, and a control terminal. The control terminal of the first TFT 120 can receive a data voltage. In FIG. 1, the data voltage can be transmitted by a second TFT 150. The second TFT 150 has a first terminal, a second terminal, and a control terminal. The first terminal of the second TFT 150 is coupled to a data line 20, the second terminal of the second TFT 150 is coupled to the control terminal of the first TFT 120, and the control terminal of the second TFT 150 is coupled to a scan line 18. The data line 20 is controlled by the data driver 14, and the scan line 18 is controlled by the scan driver 16. That is, when the scan driver 16 turns on the second TFT 150 by sending a corresponding signal through the scan line 18, the data voltage applied to the data line 20 can be transmitted to the control terminal of the first TFT 120 through the second TFT 150.

The capacitor 130 is coupled between the first terminal and the control terminal of the first TFT 120 for storing the data voltage received. The adaptive voltage source 140 is coupled to second terminal of the first TFT 120 and can fix a voltage between the first terminal and the second terminal of the first TFT 120, that is, the drain-to-source voltage of the first TFT 120 can be fixed. Since the drain-to-source voltage of the first TFT 120 can be fixed when driving the LED 110, the control of the LED 110 can be simplified and the luminosity uniformity of the display device 10 can be improved.

In another embodiment, the pixel circuit 100 also can be applied to a backlight plate, the end user can add more other elements based on their requirement, but not limited thereto.

In order to simplify the explanation, the following embodiments use display device 10 as an example.

In FIG. 1, the first TFT 120 is a P-type TFT. The LED 110 has a first electrode and a second electrode. In some embodiments, for example, the present embodiment, the first electrode can be the anode of the LED 110, and the second electrode can the cathode of the LED 110. However, in some other embodiments, the first electrode can be the cathode of the LED 110, and the second electrode can be the anode of the LED 110. A first node of the adaptive voltage source 140 is coupled to the second electrode of the LED 110 for providing an adaptive voltage VA1, and a second node of the adaptive voltage source 140 is coupled to the second terminal of the first TFT 120. The first terminal of the first TFT 120 can receive a first system voltage PVDD, and the second terminal of the first TFT 120 is coupled to the first electrode of the LED 110.

In this case, instead of providing a second system voltage to the second electrode of the LED 110, the adaptive voltage source 140 can provide the adaptive voltage VA1 to the second electrode of the LED 110. The adaptive voltage source 140 can sense the voltage VS at the second terminal of the first TFT 120, and adjust the adaptive voltage VA1 when the voltage VS changes, so the voltage VS can be pulled back to a predetermined level. Therefore, the voltage between the first terminal and the second terminal of the first TFT 120 can be fixed.

For example, in FIG. 1, the adaptive voltage source 140 can include a first operational amplifier (OPA) 142. The first OPA 142 has a first input terminal, a second input terminal, and an output terminal. The first input terminal of the first OPA 142 is coupled to the second terminal of the first TFT 120, the second input terminal of the first OPA 142 receives a reference voltage Vref, and the output terminal of the first OPA 142 is coupled to the second electrode of the LED 110 for providing the adaptive voltage VA1.

In this case, when the voltage VS at the second terminal of the first TFT 120 changes, the adaptive voltage source 140 will also change its output voltage, that is, the adaptive voltage VA1, to keep the voltage VS to be the same as the reference voltage Vref. In some embodiments, the reference voltage Vref can be a substantially fixed voltage of the system, the fixed voltage can be a positive voltage, a negative voltage or substantially the ground voltage, but not limited thereto. The fixed voltage can be the ground voltage, and the adaptive voltage VA1 provided by the adaptive voltage source 140 would be negative, that is, lower than the ground voltage, and the second terminal of the first TFT 120 is virtually grounded by the adaptive voltage source 140. Here, the concept of virtually grounded is equipotential voltage. That is, if the input impedance of the first OPA 142 is assumed to be substantially infinity, the voltage difference between the first input terminal and the second terminal of the first OPA 142 would be substantially equal to zero, therefore, the voltage of the first input terminal and the second input terminal of the OPA are the same.

Figure 2:
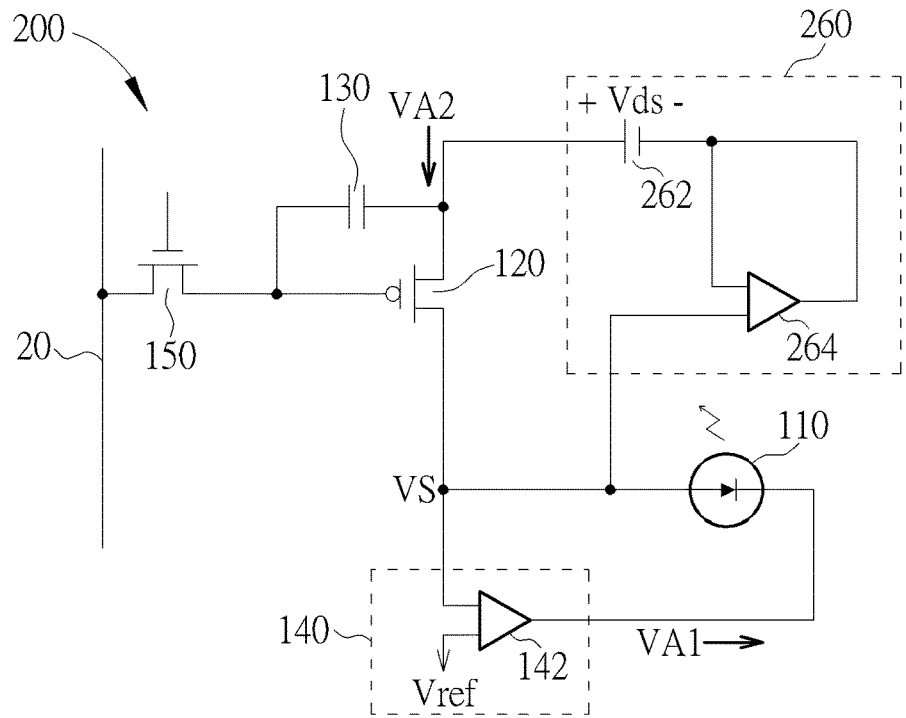
FIG. 2 shows a pixel circuit according to one embodiment of the present disclosure.

In some embodiments, the pixel circuit 100 may further include another adaptive voltage source to supply another adaptive voltage for replacing the first system voltage PVDD. FIG. 2 shows a pixel circuit 200 according to another embodiment. The pixel circuit 200 can be applied to the display device 10 to replace the pixel circuit 100. The pixel circuit 200 and the pixel circuit 100 have similar structures. However, the pixel circuit 200 further includes an adaptive voltage source 260 for providing the adaptive voltage VA2.

The adaptive voltage source 260 includes a constant voltage source 262, and a second OPA 264. The constant voltage source 262 has a first terminal and a second terminal. The first terminal of the constant voltage source 262 is coupled to the first terminal of the first TFT 120. In this embodiment, the voltage at the first terminal of the constant voltage source 262 can be higher than the voltage at the second terminal of the constant voltage source 262. The predetermined Vds can be decided according to the drain-to-source voltage required by the first TFT 120.

The second OPA 264 has a first input terminal, a second input terminal, and an output terminal. The first input terminal of the second OPA 264 is coupled to the second terminal of the constant voltage source 262, the second input terminal of the second OPA 264 is coupled to the second terminal of the first TFT 120, and an output terminal of the second OPA 264 is coupled to the first input terminal of the second OPA 264.

In this case, since the first input terminal of the second OPA 264 will be virtually grounded through the first and the second OPAs 142 and 264, the voltage between the first terminal and the second terminal of the first TFT 120 can be further fixed by the constant voltage source 262.

Figure 3:
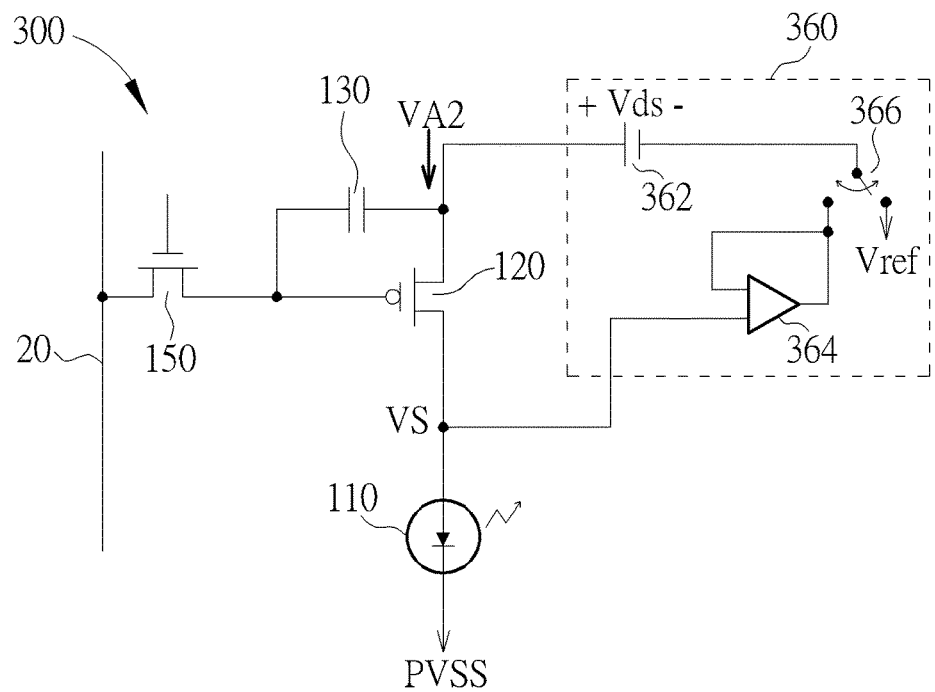
FIG. 3 shows a pixel circuit according to another embodiment of the present disclosure.

In some embodiments, the pixel circuit 200 may use only the adaptive voltage source 260, and can remove the adaptive voltage source 140. FIG. 3 shows a pixel circuit 300 according to another embodiment. The pixel circuit 300 can be applied to the display device 10 to replace the pixel circuit 100.

A first node of the adaptive voltage source 360 of the pixel circuit 300 is coupled to the first electrode of the LED 110, and a second node of the adaptive voltage source 360 is coupled to the first terminal of the first TFT 120 for providing the adaptive voltage VA2. Also, the second terminal of the first TFT 120 is coupled to the first electrode of the LED 110, and the second electrode of the LED 110 would receive the second system voltage PVSS. The first system voltage PVDD can be a positive constant voltage or a negative constant voltage.

In this case, the adaptive voltage VA2 can be higher than the second system voltage PVSS. That is, instead of providing the first system voltage PVDD to the first terminal of the first TFT 120, the adaptive voltage source 360 can provide the adaptive voltage VA2 to the first terminal of the first TFT 120. Also, the second system voltage PVSS can be a positive constant voltage, a negative constant voltage or a ground reference voltage. The adaptive voltage source 360 can sense the voltage VS at the second terminal of the first TFT 120, and adjust the adaptive voltage VA2 when the voltage VS changes so that the voltage VS can be pulled back to a predetermined level. Consequently, the voltage between the first terminal and the second terminal of the first TFT 120 can be fixed.

In FIG. 3, the adaptive voltage source 360 includes a constant voltage source 362, a first OPA 364, and a switch 366. The constant voltage source 362 has a first terminal and a second terminal. The first terminal of the constant voltage source 362 is coupled to the first terminal of the first TFT 120. The voltage at the first terminal of the constant voltage source 362 can be higher than the voltage at the second terminal of the constant voltage source 362. The predetermined voltage Vds can be defined according to the desired drain-to-source voltage required by the first TFT 120.

The first OPA 364 has a first input terminal, a second input terminal and output terminal, the second input terminal of the first OPA 364 is coupled to the second terminal of the first TFT 120, and the output terminal of the first OPA 364 is coupled to the first input terminal of the first OPA 364. The switch 366 can build an electrical connection between the second terminal of the constant voltage source 362 and a reference voltage terminal for providing a first reference voltage Vref during a scan operation of the pixel circuit 300, and can build an electrical connection between the second terminal of the constant voltage source 362 and the output terminal of the first OPA 364 during a driving operation of the pixel circuit 300. During the scan operation, the second TFT 150 is turned on to transmit the data signal sending from the data line 20 to turn on first TFT 120. Moreover, during the driving operation following the scan operation, the second TFT 150 would be turned off and stop transmitting the data signal to first TFT 120.

That is, when the voltage VS at the second terminal of the first TFT 120 changes, the adaptive voltage source 360 would change its output voltage VA2 so that the voltage between the first terminal and the second terminal of the first TFT 120 can be fixed, simplifying the voltage control of the pixel circuit 300 and improving the luminosity uniformity of the display device 10.

Figure 4:
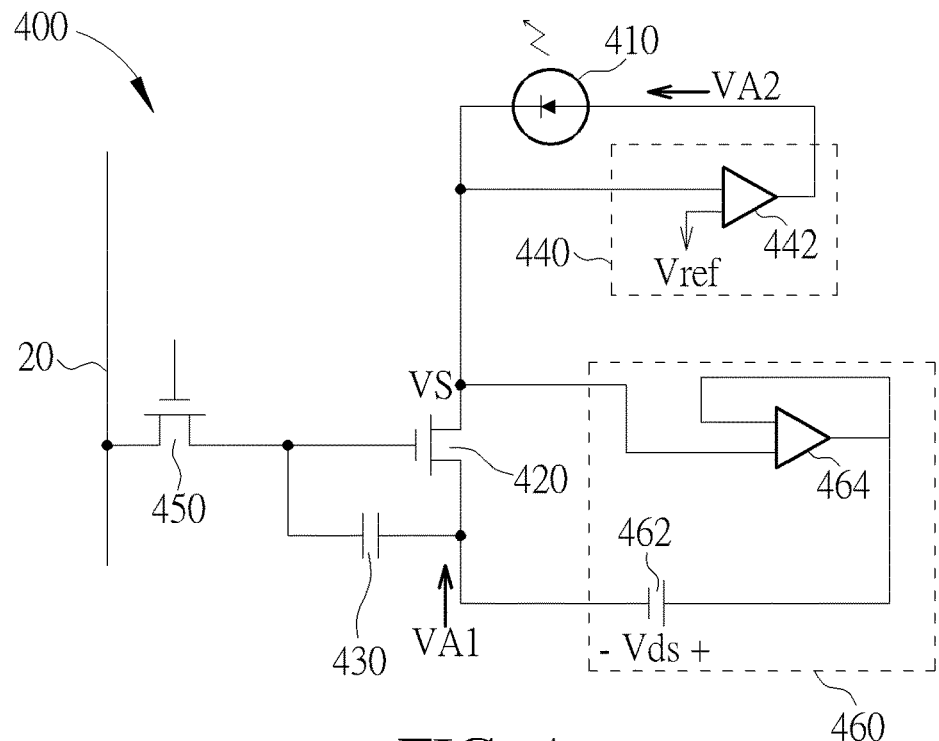
FIG. 4 shows a pixel circuit according to another embodiment of the present disclosure.

In some embodiments, the first TFT 120 can also be implemented by an N-type transistor. FIG. 4 shows a pixel circuit 400 according to another embodiment.

The pixel circuit 400 includes an LED 410, a first TFT 420, a capacitor 430, an adaptive voltage source 440, a second TFT 450, and an adaptive voltage source 460. The pixel circuit 400 can be applied to the display device 10 to replace the pixel circuit 100.

In the pixel circuit 400, the first TFT 420 is an N-type TFT. The first node of the adaptive voltage source 440 can be coupled to the first electrode of the LED 410 for providing an adaptive voltage VA2, and the second node of the adaptive voltage source 440 can be coupled to the second terminal of the first TFT 420. The first terminal of the first TFT 420 can receive the adaptive voltage VA1, and the second terminal of the first TFT 420 can be coupled to the second electrode of the LED 410.

In this case, the adaptive voltage VA2 can be higher than the second system voltage PVSS. That is, instead of providing the first system voltage PVDD to the first electrode of the LED 410, the adaptive voltage source 440 can provide the adaptive voltage VA2 to the first electrode of the LED 410. The adaptive voltage source 440 can sense the voltage VS at the second terminal of the first TFT 420, and adjust the adaptive voltage VA2 when the voltage VS changes so that the voltage VS can be pulled back to a predetermined level. Consequently, the voltage between the first terminal and the second terminal of the first TFT 420 can be fixed.

For example, in FIG. 4, the adaptive voltage source 440 includes a first OPA 442. The first OPA 442 has a first input terminal, a second input terminal, and an output terminal. The first input terminal of the first OPA 442 is coupled to the second terminal of the first TFT 420, the second input terminal of the first OPA 442 receives the reference voltage Vref, and the output terminal of the first OPA 442 is coupled to the first electrode of the LED 410 for providing the adaptive voltage VA2.

That is, if the reference voltage Vref is the ground voltage of the system, the second terminal of the first TFT 420 can be deemed as being virtually grounded.

Furthermore, in FIG. 4, the adaptive voltage source 460 can provide the adaptive voltage VA1 to replace the second system voltage PVSS. The adaptive voltage source 460 includes a constant voltage source 462, and a second OPA 464. The constant voltage source 462 has a first terminal and a second terminal, and the second terminal of the constant voltage source 462 is coupled to the first terminal of the first TFT 420. The voltage at the first terminal of the constant voltage source 462 can be higher than the voltage at the second terminal of the constant voltage source 462. The predetermined voltage Vds can be defined according to the desired drain-to-source voltage required by the first TFT 420.

The second OPA 464 has a first input terminal, a second input terminal, and an output terminal. The first input terminal of the second OPA 464 is coupled to the first terminal of the constant voltage source 462, the second input terminal of the second OPA 464 is coupled to the second terminal of the first TFT 420, and an output terminal of the second OPA 464 is coupled to the first input terminal of the second OPA 464.

In this case, since the first input terminal of the second OPA 464 will be virtually grounded through the first and the second OPAs 442 and 464, the voltage VS at the second terminal of the first TFT 420 can be further fixed by the constant voltage source 462.

In some embodiments, since the adaptive voltage source 440 is able to fix the voltage VS at the second terminal of the first TFT 420, the pixel circuit 400 may use only the adaptive voltage source 440 by simply removing the adaptive voltage source 460 from the pixel circuit 400 according to the system requirement. In this case, the first terminal of the first TFT 420 can receive the second system voltage PVSS.

Figure 5:
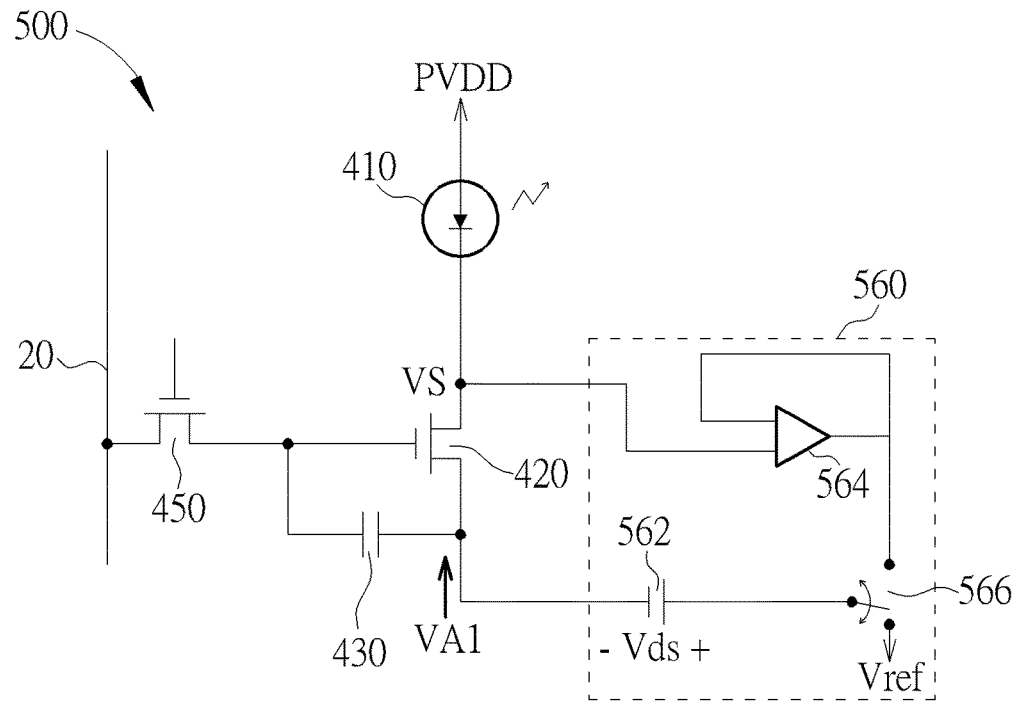
FIG. 5 shows a pixel circuit according to another embodiment of the present disclosure.

FIG. 5 shows a pixel circuit 500 according to another embodiment. The pixel circuit 500 can be applied to the display device 10 to replace the pixel circuit 100.

In the pixel circuit 500, the first TFT 420 is an N-type TFT. The first node of the adaptive voltage source 560 is coupled to the second electrode of the LED 410, and the second node of the adaptive voltage source 560 is coupled to the first terminal of the first TFT 420 for providing the adaptive voltage VA1. The first electrode of the LED 410 can receive the first system voltage PVDD, and the second electrode of the LED 410 can be coupled to the second terminal of the first TFT 420.

In this case, the first system voltage PVDD can be higher than the adaptive voltage VA1. That is, instead of providing the second system voltage PVSS to the first terminal of the first TFT 420, the adaptive voltage source 560 can provide the adaptive voltage VA1 to the first terminal of the first TFT 420. The adaptive voltage source 560 can sense the voltage VS at the second terminal of the first TFT 420, and adjust the adaptive voltage VA1 when the voltage VS changes so that the voltage VS can be pulled back to a predetermined level. Consequently, the voltage between the first terminal and the second terminal of the first TFT 420 can be fixed.

For example, the adaptive voltage source 560 can include a constant voltage source 562, a first OPA 564, and a switch 566. The constant voltage source 562 has a first terminal and a second terminal, the second terminal of the constant voltage source 562 is coupled to the first terminal of the first TFT 420. The voltage at the first terminal of the constant voltage source 562 can be higher than the voltage at the second terminal of the constant voltage source 562. The predetermined voltage Vds can be defined according to the desired drain-to-source voltage required by the first TFT 420.

The first OPA 564 has a first input terminal, a second input terminal, and a output terminal, the second input terminal of the first OPA 564 is coupled to the second terminal of the first TFT 420, and the output terminal of the first OPA 564 coupled to the first input terminal of the first OPA 564. The switch 566 can build an electrical connection between the first terminal of the constant voltage source 562 and a reference voltage terminal for providing the reference voltage Vref during a scan operation of the pixel circuit 500, and build an electrical connection between the first terminal of the constant voltage source 562 and the output terminal of the first OPA 564 during a driving operation of the pixel circuit 500.

That is, when the voltage VS at the second terminal of the first TFT 420 changes, the adaptive voltage source 560 would change its output voltage VA1 so that the voltage between the first terminal and the second terminal of the first TFT 420 can be fixed, simplifying the voltage control of the pixel circuit 500 and improving the luminosity uniformity of the display device 10.

Figure 6:
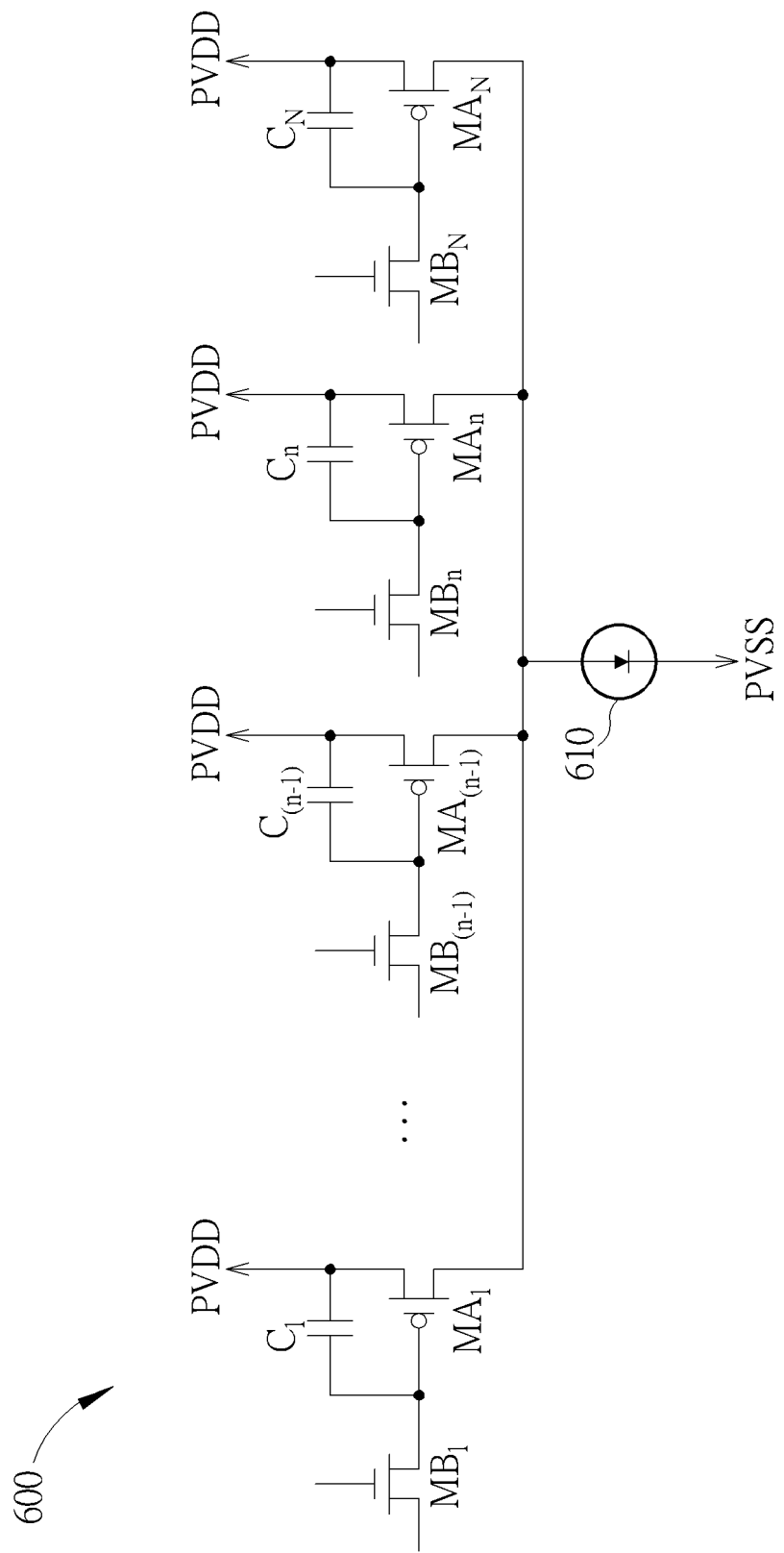
FIG. 6 shows a pixel circuit according to another embodiment of the present disclosure.

FIG. 6 shows a pixel circuit 600 according to another embodiment of the present disclosure. The pixel circuit 600 can be applied to the display device 10 to replace the pixel circuit 100 according to the system requirement.

The pixel circuit 600 includes an LED 610, plural first TFTs $MA_1$ to $MA_N$, and capacitors $C_1$ to $C_N$, where N is an integer and greater than 1. The N first TFTs $MA_1$ to $MA_N$ are coupled to the LED 610, and each of the N first TFTs $MA_1$ to $MA_N$ is controlled by a corresponding control signal. Also, the capacitors $C_1$ to $C_N$ are coupled between a first terminal and a control terminal of a corresponding first TFT for storing the received data voltage. However, in some embodiments, some of the capacitors $C_1$ to $C_N$ may be omitted if the corresponding first TFT has parasitic enough capacitance to keep the data voltage. In this case, instead of including N capacitors $C_1$ to $C_N$, the pixel circuit 600 may include less than N capacitors according to the system requirement.

In FIG. 6, the N first TFTs $MA_1$ to $MA_N$ are P-type transistors. In this case, the LED 610 has a first electrode and a second electrode. Each of the first TFTs $MA_1$ to $MA_N$ has a first terminal, a second terminal, and a control terminal. The first terminal of each of the plural first TFTs $MA_1$ to $MA_N$ receives the first system voltage PVDD, the second terminal of each of the plural first TFTs $MA_1$ to $MA_N$ is coupled to the first electrode of the LED 610, and the control terminal of each of the plural first TFTs $MA_1$ to $MA_N$ receives a corresponding data signal. The second electrode of LED 610 receives the second system voltage PVSS.

In some embodiments, the pixel circuit 600 can further include second TFTs $MB_1$ to $MB_N$. Each of the second TFTs $MB_1$ to $MB_N$ has a first terminal, a second terminal, and a control terminal. The first terminal of each of the second TFTs $MB_1$ to $MB_N$ is coupled to a corresponding data line for transmitting the corresponding data signal, the second terminal of each of the second TFTs $MB_1$ to $MB_N$ is coupled to the control terminal of a corresponding first TFT of the first TFTs $MA_1$ to $MA_N$, and the control terminal of each of the second TFTs $MB_1$ to $MB_N$ is coupled to a corresponding scan line.

When the pixel circuit 600 is applied to the display device 10, the data lines can be controlled by the data driver 14, and the scan lines can be controlled by the scan driver 16. That is, when the scan driver 16 turns on the second TFTs $MB_1$ to $MB_N$ by sending the corresponding signal through the scan lines 18, the data signals applied to the data lines 20 can be transmitted to the control terminals of the first TFTs $MA_1$ to $MA_N$ through the second TFTs $MB_1$ to $MB_N$.

In some embodiments, the channel width-to-length ratios of the first TFTs $MA_1$ to $MA_N$ can be substantially the same, and the first TFTs $MA_1$ to $MA_N$ can be controlled independently. For example, to present a specific gray level, a first set of the plural first TFTs $MA_1$ to $MA_N$ may be turned on, and a second set of the plural first TFTs $MA_1$ to $MA_N$ may be turned off. That is, some of the plural first TFTs $MA_1$ to $MA_N$ are turned on while some of the plural first TFTs $MA_1$ to $MA_N$ are turned off. Since the first TFTs $MA_1$ to $MA_N$ may generate currents with substantially the same intensities when being turned on, by controlling the number of first TFTs in the first set to be turned on, the gray level presented by the pixel circuit 600 can be adjusted.

In this case, the pixel circuit 600 is able to generate (N+1) gray levels in a linear manner to the most with the N first TFTs $MA_1$ to $MA_N$. However, in some embodiments, with the N first TFTs $MA_1$ to $MA_N$, the pixel circuit 600 may generate less gray levels so the luminance transition can be controlled in an arbitrary manner for presenting a smooth luminance transition according to the characteristic of human visual sensation. In this case, the number of first TFTs to be turned on can be decided by a lookup table predetermined by the system.

Also, to provide even more gray levels with the same number of first TFTs in the pixel circuit 600, the channel width-to-length ratios of the first TFTs $MA_1$ to $MA_N$ may be different. For example, the channel width-to-length ratio of the $n^{th}$ first TFT $MA_n$ of the plural first TFTs $MA_1$ to $MA_N$ can be substantially two times the channel width-to-length ratio of the $(n-1)^{th}$ first TFT $MA_{(n-1)}$ of the plural first TFTs $MA_1$ to $MA_N$, where n is an integer and greater than 1.

In this case, the intensity of the current generated by the $n^{th}$ first TFT $MA_n$ would be two times the intensity of the current generated by the $(n-1)^{th}$ first thin film transistor $MA_{(n-1)}$. Therefore, by turning on different sets of the plural first TFTs $MA_1$ to $MA_N$, the pixel circuit 600 would be able to generate $2^N$ gray levels at most in a linear manner. However, to make the luminance transition meet the characteristic of human visual sensation, less gray levels may be used to offer an arbitrary luminance transition.

Furthermore, in some embodiments, to perform a predetermined arbitrary luminance transition in a more efficient way, some of the first TFTs may have the same size while some of the first TFTs may have different sizes. That is, according to the luminance transition to be presented, the sizes of the first TFTs $MA_1$ to $MA_N$ and the sets of the first TFTs $MA_1$ to $MA_N$ to be turned on for presenting the corresponding specific gray levels can be decided in advance accordingly.

Since the pixel circuit 600 can generate more gray levels with plural first TFTs $MA_1$ to $MA_N$, the data signals can be controlled easily without fine adjustment, simplifying the voltage control of the pixel circuit 600 and improving the luminosity uniformity of the display device 10.

In the aforementioned embodiments, the pixel circuit 600 may receive data signals with two data voltages for turning on and turning off the first TFTs $MA_1$ to $MA_N$. However, in some other embodiments, the pixel circuit 600 may receive data signals with more steps so the first TFTs $MA_1$ to $MA_N$ can be turned on by different levels to generate different levels of currents, generating even more gray levels.

Figure 7:
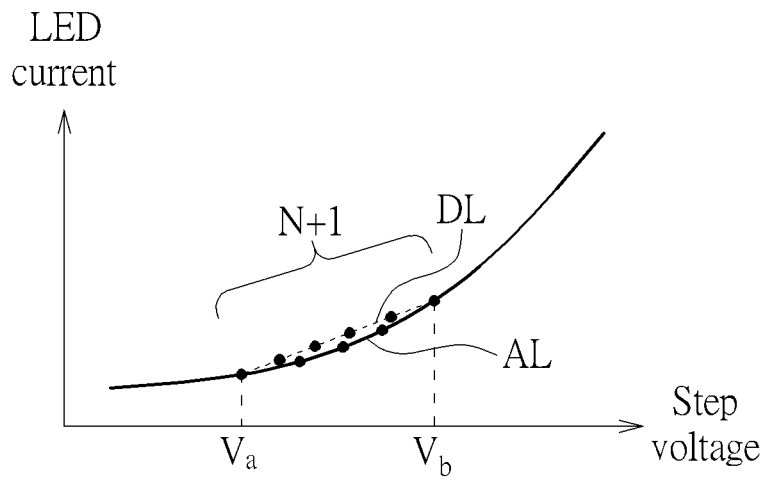
FIG. 7 shows a voltage-to-current diagram of the pixel circuit in FIG. 6 according to one embodiment.

FIG. 7 shows a voltage-to-current diagram of the pixel circuit 600 according to one embodiment. In this case, the data signals received by a first set of the plural first TFTs $MA_1$ to $MA_N$ can be at a first step voltage Va to enable the first set of the plural first TFTs $MA_1$ to $MA_N$. Each of the first set of the plural first TFTs $MA_1$ to $MA_N$ is turned on and generates a first current. The data signals received by a second set of plural first TFTs $MA_1$ to $MA_N$ are at a second step voltage Vb to enable the second set of the plural first TFTs $MA_1$ to $MA_N$. Each of the second set of the plural first TFTs $MA_1$ to $MA_N$ is turned on and generates a second current different from the first current.

Therefore, by adjusting the number of the first TFTs receiving the first step voltage Va and the number of first TFTs receiving the second step voltage Vb, the pixel circuit 600 can generate (N+1) levels of currents when sending data signals with at least one of the step voltages Va and Vb, if the first TFTs $MA_1$ to $MA_N$ all have the same size. That is, with the step voltages Va and Vb, the N first TFTs $MA_1$ to $MA_N$ of the pixel circuit 600 are able to generate (N+1) gray levels in a linear manner along the dot line DL shown in FIG. 7.

In addition, if there are total M (M>1) possible step voltages are applicable to the pixel circuit 600, that is, if each of the first TFT can be controlled to present M states with the M step voltages, then the N first TFTs $MA_1$ to $MA_N$ of the pixel circuit 600 would be able to generate K linear gray levels totally, and K equals to $(N+M-1)!/[N!(M-1)!]$. Consequently, the pixel circuit 600 is able to generate even more gray levels comparing to the previous embodiment with TFTs having only two states of being turned on or turned off.

However, in some embodiments, gray levels in an arbitrary manner meeting the characteristics of human visual sensation can also be provided by the pixel circuit 600. For example, when sending the data signals with step voltages Va or Vb to the first and the second sets of first TFTs $MA_1$ to $MA_N$, different gray levels meeting the arbitrary curve AL shown in FIG. 7 can be achieved by choosing proper numbers of TFTs for the first set and the second set of the first TFTs $MA_1$ to $MA_N$ with a predetermined lookup table. However, to meet the irregular difference between each two gray levels on the arbitrary curve with step voltages Va and Vb, the number of gray levels generated by the N first TFTs $MA_1$ to $MA_N$ of the pixel circuit 600 would be less than (N+1). That is, to present (N+1) gray levels with step voltages Va and Vb, the pixel circuit 600 would require more first TFTs.

Figure 8:
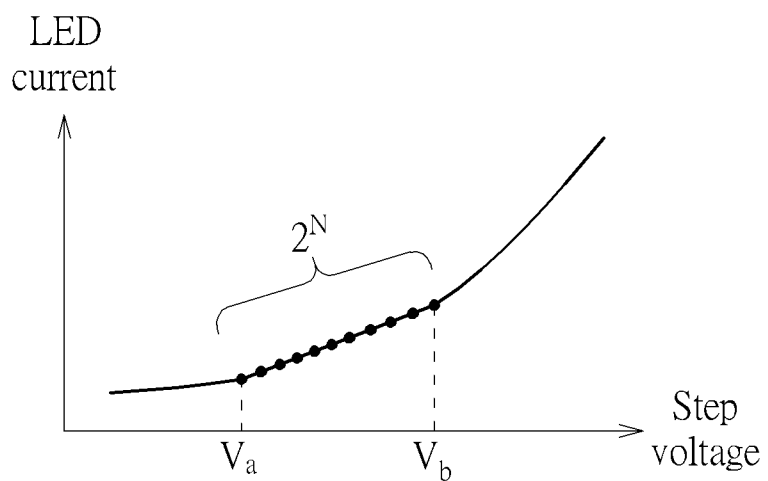
FIG. 8 shows a voltage-to-current diagram of the pixel circuit in FIG. 6 according to another embodiment.

Also, the same approach of applying data signals with different step voltages can be applied to the plural first TFT $MA_1$ to $MA_n$ with different sizes. FIG. 8 shows a voltage-to-current diagram of the pixel circuit 600 according to another embodiment. In FIG. 8, the plural first TFT $MA_1$ to $MA_n$ all have different sizes. For example, the channel width-to-length ratio of an $n^{th}$ first TFT $MA_n$ is substantially two times the channel width-to-length ratio of the $(n-1)^{th}$ first TFT $MA_{(n-1)}$, where n can be any of integers from 2 to N. In this case, $2^N$ linear gray levels can be generated when sending data signals with at least one of the step voltages Va and Vb. Moreover, if there are total M possible step voltages are applicable to the pixel circuit 600, that is, if each of the first TFT can be controlled to present M states with the M step voltages, then the N first TFTs $MA_1$ to $MA_N$ of the pixel circuit 600 would be able to generate $M^N$ gray levels.

Furthermore, in some embodiments, if the frame rate of the images presented by the display device 10 is rather high, for example, higher than 120 fps, then the display device 10 may have the pixel circuit 600 present two different gray levels in two successive frames to generate an intermediate gray level between the two different gray levels due to the persistence of vision.

Figure 9:
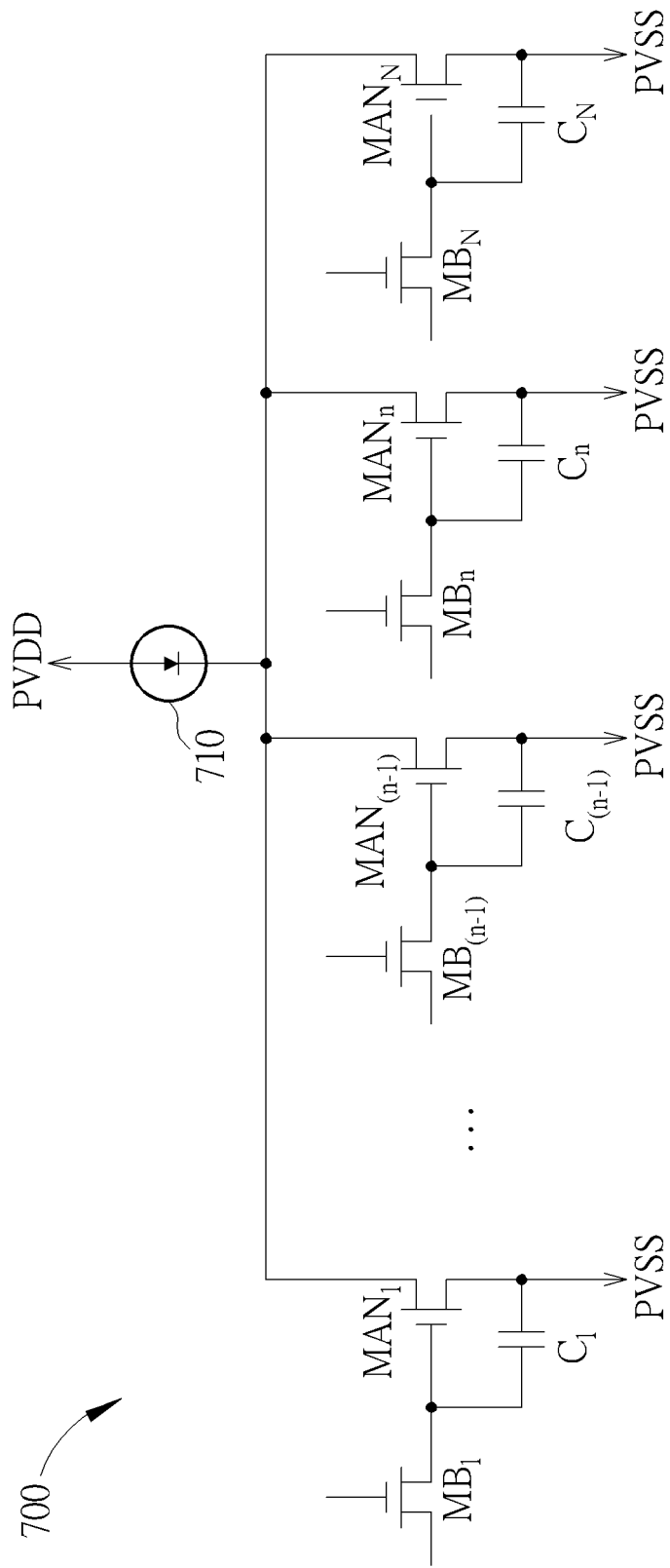
FIG. 9 shows a pixel circuit according to another embodiment of the present disclosure.

In FIG. 6, the plural first TFT $MA_1$ to $MA_n$ in the pixel circuit 600 are P-type transistors, however, in some other embodiments, the first plural first TFTs $MA_1$ to $MA_N$ can also be implemented by an N-type transistors. FIG. 9 shows a pixel circuit 700 according to another embodiment. The pixels circuits 600 and 700 have similar structures; however, the plural first TFTs $MAN_1$ to $MAN_N$ of the pixel circuit 700 are N-type transistors.

In this case, the light emitting diode 710 has a first electrode and a second electrode, and the first electrode of the LED can receive the first system voltage PVDD. Each of the first TFTs $MAN_1$ to $MAN_N$ has a first terminal, a second terminal, and a control terminal. The first terminal of each of the plural first TFTs $MAN_1$ to $MAN_N$ receives the second system voltage PVSS, the second terminal of each of the plural first TFTs $MAN_1$ to $MAN_N$ is coupled to the second electrode of the LED 710, and the control terminal of each of the plural first TFTs $MAN_1$ to $MAN_N$ receives a corresponding data signal. The pixel circuit 700 can be operated with the same principles as the aforementioned embodiments.

In summary, the display device provided by the embodiments of the present disclosure can include an adaptive voltage source to fix the drain-to-source voltage of the TFT for current driving, so that the luminance uniformity of the display device can be improved, and the voltage control of the pixel circuit can be simplified. Also, with the parallel current driving TFTs, the pixel circuit can generate more gray levels in a simpler way without fine tuning data signals.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device comprising:
   at least one pixel circuit, and a pixel circuit of the at least one pixel circuit comprising:
      a light emitting diode (LED) having a first electrode and a second electrode;
      a first thin film transistor (TFT) coupled to the LED, the first TFT having a first terminal configured to receive a first system voltage or a second adaptive voltage, a second terminal coupled to the first electrode of the LED, and a control terminal configured to receive a data voltage;
      a capacitor coupled between the first terminal and the control terminal of the first TFT; and
      a first adaptive voltage source coupled to the first TFT and configured to keep a voltage between the first terminal and the second terminal of the first TFT, the first adaptive voltage source having a first node coupled to the second electrode of the LED for providing a first adaptive voltage, and a second node coupled to the second terminal of the first TFT;
   wherein:
   the first TFT is a P-type TFT; and
   the first system voltage and the second adaptive voltage are higher than the first adaptive voltage.

2. The display device of claim 1, wherein the first adaptive voltage source comprises:
   a first operational amplifier (OPA) having a first input terminal, a second input terminal, and an output terminal, the first input terminal of the first OPA being coupled to the second terminal of the first TFT, the second input terminal of the first OPA being configured to receive a reference voltage, and the output terminal of the first OPA being coupled to the second electrode of the LED for providing the first adaptive voltage.

3. The display device of claim 2, wherein the pixel circuit further comprises a second adaptive voltage source for providing the second adaptive voltage, the second adaptive voltage source comprising:
- a constant voltage source having a first terminal and a second terminal, the first terminal of the constant voltage source being coupled to the first terminal of the first TFT, wherein a voltage at the first terminal of the constant voltage source is higher than a voltage at the second terminal of the constant voltage source; and
- a second OPA having a first input terminal, a second input terminal, and an output terminal, the first input terminal of the second OPA being coupled to the second terminal of the constant voltage source, the second input terminal of the second OPA being coupled to the second terminal of the first TFT, and the output terminal of the second OPA being coupled to the first input terminal of the second OPA.

4. A display device comprising:
at least one pixel circuit, and a pixel circuit of the at least one pixel circuit comprising:
- a light emitting diode (LED) having a first electrode and a second electrode;
- a first thin film transistor (TFT) coupled to the LED, the first TFT having a first terminal, a second terminal, and a control terminal configured to receive a data voltage;
- a capacitor coupled between the first terminal and the control terminal of the first TFT; and
- a first adaptive voltage source coupled to the first TFT and configured to keep a voltage between the first terminal and the second terminal of the first TFT;

wherein:
the first TFT is an N-type TFT;
a first node of the first adaptive voltage source is coupled to the first electrode of the LED for providing a first adaptive voltage, and a second node of first adaptive voltage source is coupled to the second terminal of the first TFT;
the first terminal of the first TFT is configured to receive a second system voltage or a second adaptive voltage, and the second terminal of the first TFT is coupled to the second electrode of the LED; and
the first adaptive voltage is higher than the second system voltage and the second adaptive voltage.

5. The display device of claim 4, wherein the first adaptive voltage source comprises:
- a first OPA having a first input terminal, a second input terminal, and an output terminal, the first input terminal of the first OPA being coupled to the second terminal of the first TFT, the second input terminal of the first OPA being configured to receive a reference voltage, and the output terminal of the first OPA being coupled to the first electrode of the LED for providing the first adaptive voltage.

6. The display device of claim 5, further comprising a second adaptive voltage source for providing the second adaptive voltage, the second adaptive voltage source comprising:
- a constant voltage source having a first terminal and a second terminal, and the second terminal of the constant voltage source being coupled to the first terminal of the first TFT, wherein a voltage at the first terminal of the constant voltage source is higher than a voltage at the second terminal of the constant voltage source; and
- a second OPA having a first input terminal, second input terminal, and an output terminal, the first input terminal of the second OPA being coupled to the first terminal of the constant voltage source, the second input terminal of the second OPA being coupled to the second terminal of the first TFT, and the output terminal of the second OPA being coupled to the first input terminal of the second OPA.

7. A display device comprising:
at least one pixel circuit, a pixel circuit of the at least one pixel circuit comprising:
- a light emitting diode (LED);
- a plurality of first thin film transistors (TFTs) coupled to the LED, each being controlled by a corresponding control signal; and
- at least one capacitor, each coupled between a first terminal and a control terminal of a corresponding first TFT of the plurality of first TFTs;

wherein a channel width-to-length ratio of an $n^{th}$ first TFT of the plurality of first TFTs is substantially equal to one or two times a channel width-to-length ratio of an $(n-1)^{th}$ first TFT of the plurality of first TFTs, n is an integer and greater than 1.

8. The display device of claim 7, wherein:
the plurality of first TFTs are P-type TFTs;
each of the plurality of first TFTs has a first terminal, a second terminal, and a control terminal;
the first terminal of each of the plurality of first TFTs is configured to receive a first system voltage, the second terminal of each of the plurality of first TFTs is coupled to a first electrode of the LED, and the control terminal of each of the plurality of first TFTs is configured to receive a corresponding data signal; and
a second electrode of the LED is configured to receive a second system voltage.

9. The display device of claim 7, wherein:
the plurality of first TFTs are N-type TFTs;
each of the plurality of first TFTs has a first terminal, a second terminal, and a control terminal;
a first electrode of the LED is configured to receive a first system voltage;
the first terminal of each of the plurality of first TFTs is configured to receive a second system voltage, the second terminal of each of the plurality of first TFTs is coupled to a second electrode of the LED, the control terminal of each of the plurality of first TFTs is configured to receive a corresponding data signal.

10. The display device of claim 7, wherein:
data signals received by a first set of the plurality of first TFTs are at a first step voltage to enable the first set of the plurality of first TFTs, each first TFT in the first set of the plurality of first TFTs is turned on and generates a first current; and
data signals received by a second set of the plurality of first TFTs are at a second step voltage to enable the second set of the plurality of first TFTs, each first TFT in the second set of the plurality of first TFTs is turned on and generates a second current different from the first current.

11. The display device of claim 10, wherein:
each first TFT in the first set of the plurality of first TFTs is turned on and each first TFT in the second set of the plurality of first TFTs is turned off.

12. The display device of claim 10, wherein:
each first TFT in the second set of the plurality of first TFTs is turned on and each first TFT in the first set of the plurality of first TFTs is turned off.

13. The display device of claim 10, wherein:
the first set and the second set of the plurality of first TFTs are turned on or turned off at the same time.

* * * * *